TRANSISTOR AMPLIFIERS AND THERMAL ENCLOSURE THEREFOR

Filed March 4, 1963

INVENTOR
Ernest Jadoul

BY Stevens, Davis, Miller & Mosher
ATTORNEYS

United States Patent Office 3,257,621

Patented June 21, 1966

3,257,621

TRANSISTOR AMPLIFIERS AND THERMAL ENCLOSURE THEREFOR

Ernest Jadoul, Brussels, Belgium, assignor to Anciens Etablissements Supli, Brussels, Belgium, a Belgian company Filed Mar. 4, 1963, Ser. No. 262,424
Claims priority, application Belgium, Mar. 7, 1962, 614,781
2 Claims. (Cl. 330—23)

This invention concerns improvements relating to transistor amplifiers comprising a power transistor which constitutes the first stage and carries the main current, and a control transistor or a plurality of control transistors in cascade with their collectors connected to the collector of the power transistor, while the emitter of each control transistor is connected on the one hand to the base of the transistor of the preceding stage and on the other hand, through a resistor controlling the current through the said control transistor, to the emitter of the power transistor.

The practical application of this known amplifier circuit presents difficulties which have heretofore prevented its use on a wide scale. Difficulties arise because the power transistor forming the first stage of the cascade carries almost all the output current and consequently develops a considerable amount of heat. The gain of a transistor amplifier is limited primarily by the rise in temperature of the transistors, particularly the control transistors. To prevent excessive heating of the latter and ensure stability of operation, the power transistor must be placed at a distance from the control transistors in order that they may be heated to a negligible extent only. This requirement leads to the parts constituting the amplifier being spread out.

An object of the present invention is to overcome this disadvantage and permit the provision of amplifiers of small dimensions. To this end, in such an amplifier according to the invention, the power transistor, the aforesaid resistor, and the one or more control transistors are disposed in separate enclosures insulated thermally from one another, so that the heat developed by the power transistor is not transmitted to either the said resistor or control transistors. Consequently the temperature of the latter transistors can be held substantially constant and the operation of the amplifier can be maintained stable under all conditions.

Preferably, the one or more control transistors are embedded in a mass having a high coefficient of thermal conductivity, for example a metal mass, which, if the amplifier is mounted on a base-plate, bears against the latter so that the heat developed by the control transistors is dissipated to the ambient air and their temperaure differs only very slightly from that of the air.

Figure 1:
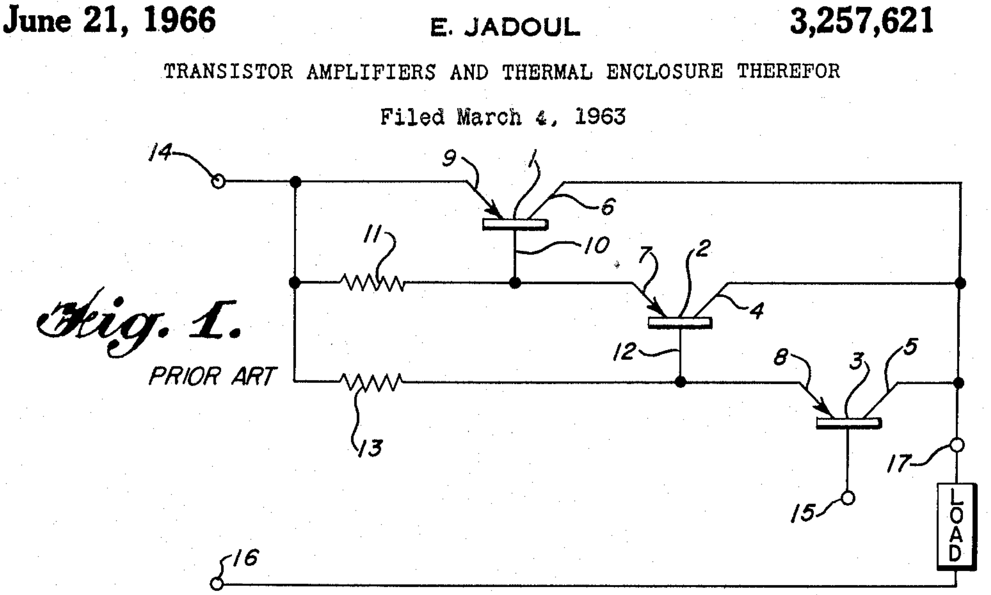

One embodiment of the invention by way of example will now be more fully described with reference to the accompanying drawing, in which:

FIGURE 1 is a circuit diagram of the amplifier, and

Figure 2:
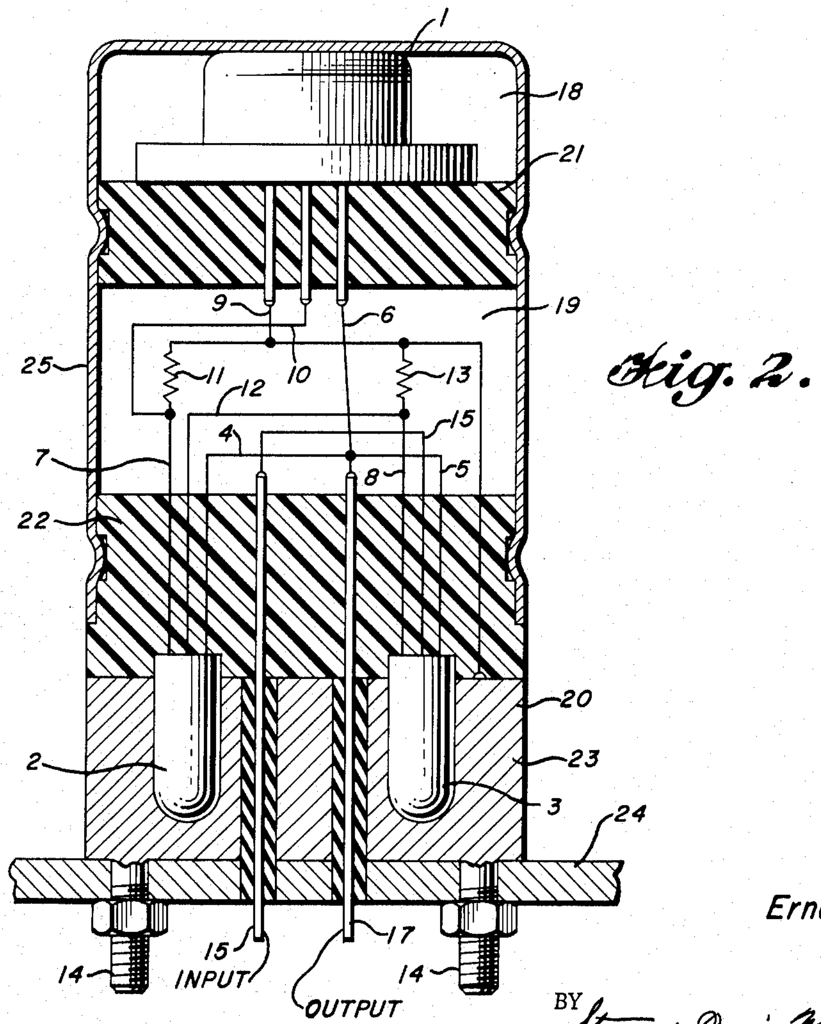

FIGURE 2 a vertical section through the amplifier.

The amplifier illustrated comprises a power transistor 1 which constitutes the first stage and carries the main current, and two control transistors 2 and 3. The latter are in cascade with their respective collectors 4 and 5 connected to the collector 6 of the power transistor 1 and their emitters 7 and 8 connected, on the one hand, to the base of the transistor of the preceding stage and, on the other hand, through a resistor, controlling the value of the current through the control transistors to the emitter 9 of the power transistor 1. Thus the emitter 7 of the transistor 2 is connected to the base 10 of the power transistor 1 and, through the resistor 11, to the emitter 9 of the power transistor, while the emitter 8 of the transistor 4 is connected to the base 12 of the transistor 2 and, through the resistor 13, to the emitter 9 of the transistor 1. The current to be amplified is supplied to the terminals 14 and 15 and the amplified current is collected at the terminals 16 and 17.

As illustrated in FIGURE 2, the power transistor 1, the resistors 11 and 13, and the control transistors 2 and 3 are disposed in separate enclosures, 18, 19 and 20 respectively, which are thermally insulated from one another by partitions 21 and 22. The partitions 21 and 22 are made of a synthetic resin having the qualities of almost no absorption of liquids and of a low radiation index. With this arrangement, the heat developed by the power transistor 1 is not transmitted either to the resistors 11 and 13 or to the control transistors 2 and 3. Consequently the temperature of the latter remains substantially constant and the operation of the amplifier is stable under all conditions.

Preferably and as illustrated, the control transistors 2 and 3 are embedded in a metal mass 23 filling the enclosure 20 and, if the amplifier is mounted on a base-plate 24, bearing against the latter. The metal mass 23 and plate 24 are made of aluminum. Because of the contact between the mass 23 and the plate 24, the heat developed by the transistors 2 and 3 is dissipated to the ambient air and their temperature differs only slightly from that of the latter.

Advantageously, the three enclosures 18, 19 and 20 are disposed one above the other, as shown, the enclosure 18 containing the power transistor 1 being above the other two at the top. A large proportion of the heat developed by the power transistor 1 is then dissipated in the ambient air without heating the other enclosures.

The amplifier is covered by a hood 25 of aluminum blackened on the outside to increase outward radiation and polished on the inside to reduce radiation towards the elements 11 and 13 in the enclosure 19.

As a result of the arrangement of the various parts, it is possible to give the amplifier very small dimensions. Resistors of any kind, whether possesing a linear characteristic or not, may be used to control the currents through the respective control transistors. An amplifier such as has been described above can readily be designed for a modulated output power of the order of one watt, while the necessary control power would be of the order of one or two millionths only of the power available at the output.

Modification may be made within the scope of the appended claims. Thus, the hood 25 may be provided with a finned top to increase the dissipation of heat to the ambient air.

There may be a single control transistor or more than two control transistors.

I claim:

1. A transistor amplifier comprising a power transistor which constitutes the first stage and carries the main current, at least one control transistor connected in cascade with the collector connected to the collector of the power transistor, the emitter of said control transistor being connected on the one hand to the base of the transistor of the preceding stage and on the other hand through a resistor controlling the current through the control transistor to the emitter of the power transistor, said control transistor being embedded in a mass having a high coefficient of thermal conductivity, a base plate, said mass being mounted on said base plate wherein said mass bears against the plate so that the heat liberated by said control transistor is dissipated to the ambient air and the temperature thereof differs only slightly from that of the air, the power transistor, the aforesaid resistor, and the control transistor being disposed in separate enclosures insulated thermally from one another, so that the heat developed by the power transistor is not transmitted to the other components.

2. An amplifier according to claim 1 wherein the enclosures are disposed one above the other so that the enclosures containing the control transistor is at the bottom against the base plate while the enclosure containing the power transistor is above the other two and consequently a large portion of heat developed by the power transistor is dissipated to the ambient air without the enclosures being heated.

References Cited by the Examiner

UNITED STATES PATENTS

| | | | |
|---|---|---|---|
| 3,013,104 | 12/1961 | Young. | |
| 3,121,188 | 2/1964 | Foster | 317—100 |

ROY LAKE, *Primary Examiner.*

F. D. PARIS, *Assistant Examiner.*